United States Patent [19]

Ducourant et al.

[11] Patent Number: 4,831,588

[45] Date of Patent: May 16, 1989

[54] INTEGRATED MEMORY CIRCUIT HAVING A DIFFERENTIAL READ AMPLIFIER

[75] Inventors: Thierry Ducourant, Crosne; Bertrand Gabillard, Paris, both of France

[73] Assignee: U.S. Philips Corp., New York, N.Y.

[21] Appl. No.: 136,576

[22] Filed: Dec. 22, 1987

[30] Foreign Application Priority Data

Dec. 23, 1986 [FR] France ................. 86 18047

[51] Int. Cl.[4] .................. G11C 7/00; G11C 11/40
[52] U.S. Cl. ................. 365/154; 365/174; 365/207; 365/189.11
[58] Field of Search .......... 365/154, 174, 189, 230, 365/208, 203, 205, 207

[56] References Cited

U.S. PATENT DOCUMENTS 4,208,730 6/1980 Dingwall et al. ............ 365/203
4,507,759 3/1985 Yasui et al. .............. 365/208 X Primary Examiner—Stuart N. Hecker
Assistant Examiner—Alyssa H. Bowler
Attorney, Agent, or Firm—Steven R. Biren

[57] ABSTRACT

A monolithic integrated memory includes a differential read amplifier circuit which is associated with a column of the memory and which has two source-coupled field effect transistors, the coupling point of which is controlled by a current source which itself is controlled by the output signal of a decoder stage which enables the selection of the memory column. The gate of each coupled transistor receives the signal of a bit line of the memory column, while the drains of the coupled transistors apply a signal to the read bus of the memory. A translator circuit is provided for translating the levels of the signals transported by the bit lines in order to ensure that these levels are at most equal to the levels of the signals transported by the read bus, so that the gate-drain capacitances of the coupled transistors of the differential amplifier are negligibly small.

3 Claims, 2 Drawing Sheets

INTEGRATED MEMORY CIRCUIT HAVING A DIFFERENTIAL READ AMPLIFIER

BACKGROUND OF THE INVENTION

The invention relates to a monolithic integrated memory circuit, constructed by means of enhancement transistors provided on a semiconductor substrate of a material of the group III-V, preferably Gallium Arsenide (GaAs), comprising a matrix of memory cells arranged in rows and columns, each memory cell of a column being connected to a first and a second bit line, which bit lines are coupled to a differential read amplifier circuit, said differential read amplifier circuit comprising two source-coupled field effect transistors, the coupled sources of which are controlled by a current source which itself is controlled by the output signal of an address decoder stage which enables the selection of the memory column, the drains of the coupled transistors providing a signal to the read bus of the memory.

A static random access memory comprising such a differential read amplifier circuit is known from the publication "Design of GaAs 1k bits static RAM" by MASAYUKI INO et al, IEEE Transactions on Electron Devices, Vol. ED-31, No. 9, September 1984 pages 1139-1144. This document describes a 1k bit static memory realized by means of gallium arsenide (GaAs) field effect transistors in direct coupled FET logic (DCFL) offering a low power consumption, high speed operation and a high integration density.

However, the gate-drain capacitance appearing during operation of the coupled transistors of this differential amplifier increases the rise time of the output signals collected on the read bus, thus increasing the memory access time and the transition time of the output signal.

SUMMARY OF THE INVENTION

In accordance with the invention, these drawbacks are avoided by means of a memory as described above which is characterized in that a level shift circuit is provided for shifting the levels of the signals transported by the bit lines in order to ensure that these levels are at the most equal to the levels of the signals transported by the read bus inputs of the level shift circuit being connected to the two bit lines and outputs of the level shift circuit being connected to the gated of the source coupled transistors, so that the gate-drain capacitances of the coupled transistors of the differential amplifier are negligibly small.

In an embodiment in accordance with the invention, the memory is characterized in that the level shift circuit is formed by a first pair of field effect transistors whose common drain is connected to a positive DC supply voltage $V_{DD}$, their gates receiving the signals of the bit lines of the memory column, each of their sources being connected to the drain of one of the transistors of a second pair of field effect transistors whose sources are connected to ground via a resistance and whose gates are cross-wise connected on the one hand to the drain of the opposed transistor of the pair and on the other hand to the respective gates of the transistors of the differential read amplifier, the lines of the read bus being connected to the DC supply voltage $V_{DD}$ via paired resistances.

The invention thus offers inter alia the following advantages.

the levels of the control signals for the gates of the coupled transistors forming the differential read amplifier are no longer the levels of the signals of the bit lines of the column of the associated memory, but rather the levels which are at the most equal to the levels circulating on the read bus.

In these circumstances, the gate-drain capacitances of the coupled transistors of the differential read amplifier can be completely ignored, which means that:

the total parasitic capacitance associated with the read bus is substantially reduced;

the rise time of the output signals of the differential read amplifier is shorter, as if the signals of the bit lines were applied directly to the gates of these coupled transistors;

the transition time of the output signal of the differential read amplifier is shorter because the time constant RC is very small;

the access time of the memory is shorter;

the dispersion of the access time is also reduced;

the static RAM has a higher performance, without its size being substantially increased, because the level shift circuit requires only four transistors and one supplementary resistor for each memory colum.

BRIEF DESCRIPTION OF THE DRAWINGS

The invention will be described in detail hereinafter with reference to the accompanying drawing, which.

DESCRIPTION OF THE PREFERRED EMBODIMENTS

Figure 1:
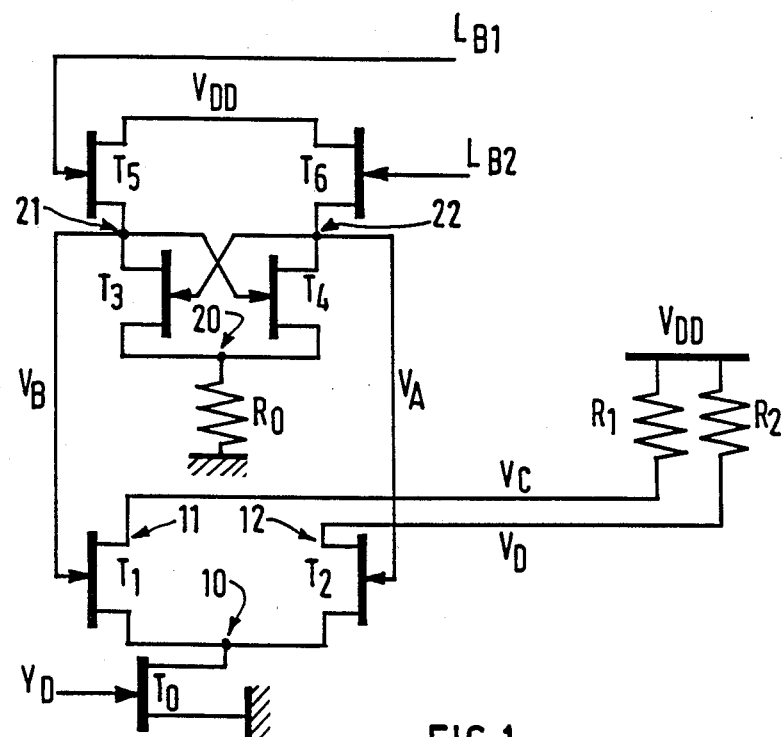
FIG. 1 shows the differential read amplifier associated with a memory column and provided with a level shift circuit in accordance with the invention.
Figure 2:
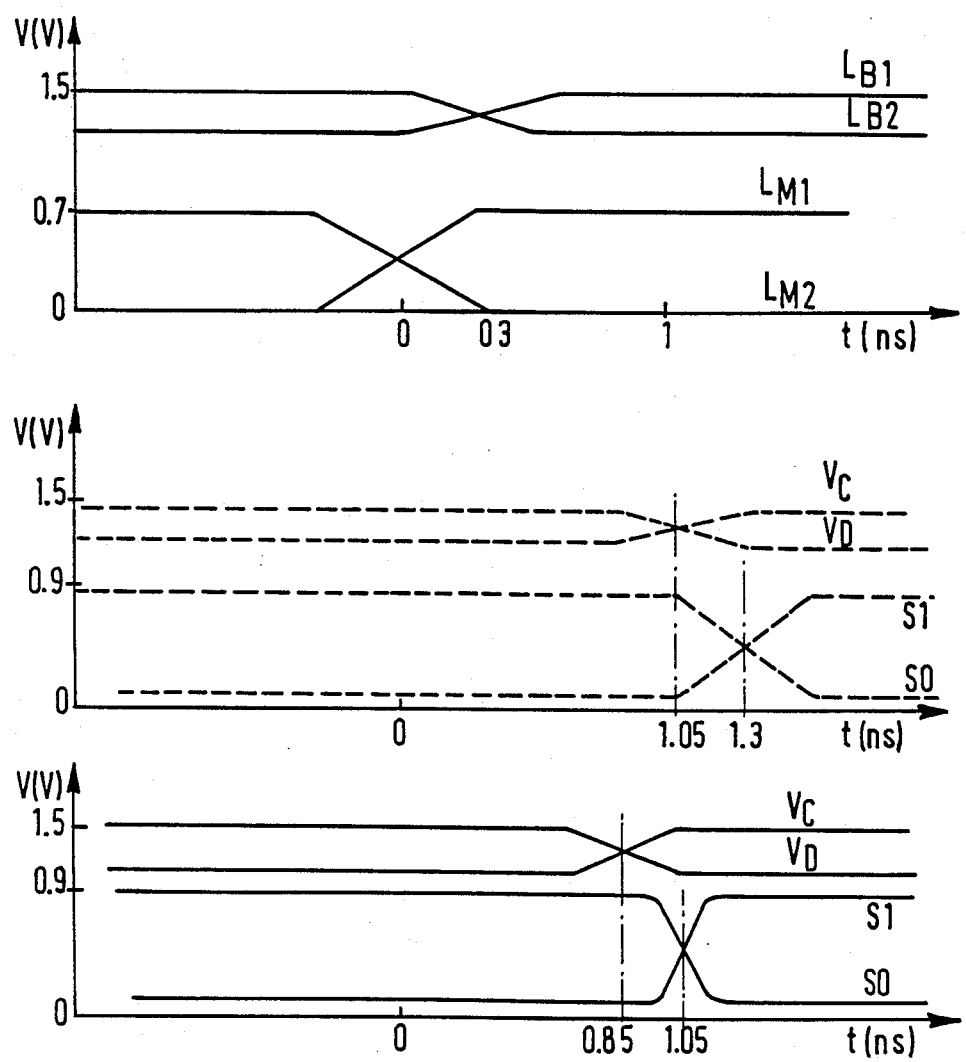
FIG. 2 shows the sequencing of the signals in a circuit in accordance with the invention, denoted by non-interrupted lines, in comparison with the sequencing of the signals in a read amplifier which is not provided with a level shifter in accordance with the invention (denoted by interrupted lines).

As appears from FIG. 1, the differential read amplifier comprises a pair of enhancement-type field effect transistors $T_1$ and $T_2$ (MESFET) whose common source 10 is connected to the drain of a transistor $T_0$. The transistor $T_0$, whose source is connected to ground, operates as a current source and is controlled by the signal $Y_D$ supplied by the decoder which selects a memory column from N columns, the differential read amplifier being associated with one of these columns; however, the decoder circuit is not shown. The drains of the coupled transistors $T_1$ and $T_2$ are connected to the lines 11 and 12, respectively, of the read bus of the memory. The lines 11 and 12 transport the signals $V_C$ and $V_D$. The gates 21 and 22 of the transistors $T_1$ and $T_2$ receive the signals $V_B$ and $V_A$, respectively.

Each memory column is associated with such a differential read amplifier circuit as is known from the cited prior art document.

In accordance with the cited document, the signals $V_B$ and $V_A$ are formed by the signals $L_{B1}$ and $L_{B2}$, respectively, which are transported by the bit lines of the memory column.

In the known embodiment of such a memory utilizing gallium arsenide field effect transistors, the lines forming the read bus are connected to a DC supply voltage $V_{DD}$ via loads. For a DC supply voltage:

$V_{DD} = 1.5$ V which is compatible with this circuit, the signals on the bit lines have an amplitude:

$L_{B1} = 1.15$ V $L_{B2} = 1.45$ V and the signals on the read bus have an amplitude:

$V_C = 1.5$ V, and $V_D = 1.15$ V.

In these circumstances, the amplitude difference between, for example $L_{B2}$ and $V_D$ of the lines 12 and 22 is positive, and the gate-drain capacitance of the transistor $T_2$ is high $L_{B2} - V_D = 1.45 - 1.15 = 0.30$ V $C_{GD} = 1$ fF/um of width, which is high.

In accordance with the invention, a level transistor circuit is associated with each differential read amplifier circuit, i.e. with each memory column.

This circuit is formed by a first pair of enhancement-type field effect transistors (MESFET) $T_5$ and $T_6$ whose common drain is connected to the DC supply voltage $V_{DD}$, their gates being controlled by the signals on the lines $L_{B1}$ and $L_{B2}$, respectively.

The sources of the transistors $T_5$ and $T_6$ are connected to the drain of a pair of enhancement-type field effect transistors (MESFET) $T_3$ and $T_4$, respectively, the sources of which from a common point 20 which is connected to ground via a load $R_0$. The gates of these transistors $T_4$ and $T_3$ are controlled by the drain signals of $T_3$ and $T_4$ and are connected to the gates 21 and 22, respectively, of the transistors $T_1$ and $T_2$. The junctions 21 and 22 carry the signals $V_B$ and $V_A$, respectively.

Assuming a DC supply voltage $V_{DD} = 1.5$ V as before, the bit lines carry the signals $L_{B1} = 1.15$ V $L_{B2} = 1.45$ V.

In these circumstances, the signals on the junctions 21 and 22 are $V_L = 0.57$ V for the low state, and $V_H = 1$ V for the high state, respectively.

The differential amplifies selected by $T_0$ have a gate-drain voltage:

$V_{GD} = -0.15$ V is $V_A$ is high while at the same time $V_D$ is low, and a voltage $V'_{GD} = 0.93$ V if $V_C$ is high and at the same time $V_B$ is low.

Thus, in the worst case the gate-drain voltage of the transistors $T_1$ and $T_2$ of the differential read amplifier is still negative, so that the gate-drain capacitance can be completely ignored. Consequently, the total parasitic capacitance associated with the read bus is substantially reduced with respect to the present state of the art, and the time constant which is the product of the resistance and said capacitance is, therefore, very low.

The memory access times are reduced. The dispersion of the access time is also reduced.

Table I lists half-cross delay values obtained by simulation:

(a) in the case where the differential read amplifier is not provided with a level shifter circuit; and (b) in the case where the differential read amplifier is provided with a level shifter circuit in accordance with the invention.

TABLE I

|  | a | b |
| --- | --- | --- |
| $L_{B1}, L_{B2}$ | 300 ps | 350 ps |
| $V_A, V_B$ | — | 450 ps |
| $B_{L1}, B_{L2}$ | 1.05 ns | 850 ps |
| $S_0, S_1$ | 1.3 ns | 1.05 ns |

In table I, $L_{B1}$ and $L_{B2}$ are the signals on the bit lines; one of these signals is low when the other is high; $V_C$ and $V_D$ are the signals on the read bus; $L_{M1}$ and $L_{M2}$ are the signals on the word line of the memory; this part of the memory circuit is known to those skilled in the art and is not shown in the electrical diagram of FIG. 1; for realizing a memory which is compatible with the present invention, reference can be made, for example to the article "high speed GaAs 1k bits Static Random Access Memory" by P. O'CONNOR et al, IEEE Journal of Solid State Circuits, Vol. SC20, No. 5, October 1985, pages 1089–1081; $S_1$ and $S_0$, are the signals on the output of the memory, which output is not shown in the electrical diagram of FIG. 1; $V_A$ and $V_D$ are the intermediate signals which are only present in the circuit in accordance with the invention.

The Table II lists the values of the rise time of the output signal, measured between 20 and 80% of the logic excursion, and the logic amplitude of the differential signal on the read bus in the cases a and b defined above.

TABLE II

|  | a | b |
| --- | --- | --- |
| rise time between 20-80% | ≈400 ps | 200 ps |
| differential signal on the read bus | ≈200 mV | 350 mV |

It will be noted that the rise time is shorter in the case b, because the amplitude of the differential signal on the read bus is higher.

Thus, using the circuit in accordance with the invention, the access time of a gallium arsenide 1k bit memory can be reduced by 250 ps, an improvement of 20%. Moreover, the transition times of the output signal are reduced by 50%.

Table III lists the dimensions of the field effect transistors as well as the resistance values necessary for an embodiment of the circuit, where l is the gate length of the transistors and L is the width of the gate of these transistors of the MESFET type, The circuit is preferably a monolithic circuit integrated with the memory on a substrate of gallium arsenide or another composition of the group III–V.

TABLE III

| transistors | l (μm) | L (μm) |
| --- | --- | --- |
| $T_0$ | 0.7 | 10 |
| $T_1, T_2$ | 0.7 | 15 |
| $T_3, T_4$ | 0.7 | 8 |
| $T_5, T_6$ | 0.7 | 9 |
| resistances | R (Ω) | |
| $R_0$ | 600 | |
| $R_1, R_2$ | 750 | |

The threshold voltage of the these enhancement-type transistors is:

$V_T = 100$ mV.

What is claimed is:

1. A monolithic integrated memory circuit comprising enhancement transistors provided on a semiconductor substrate of group III–V material, comprising a differential read amplifier circuit, first and second bit lines and a matrix of memory cells arranged in rows and columns, each memory cell of a column being connected to said first and second bit lines, which bit lines are coupled to said differential read amplifier circuit, said differential read amplifier circuit comprising two source-coupled field effect transistors, a current source, the coupled sources of said differential read amplifier being controlled by said current source, which itself is controlled by the output signal of an address-decoder stage which enables the selection of the memory column, the drains of the coupled transistors providing a signal to the read bus of the memory, characterized in that an active level shift circuit comprising field effect transistors is provided for shifting the levels of the signals transported by the bit lines in order to ensure that these levels are at the most equal to the levels of the signals on the read bus inputs of that level shift circuit being connected to the two bit lines and outputs of the level shift circuit being connected to the gates of the source-coupled transistors, so that the gate-drain capacitance influence of the coupled transistors of the differential amplifier is substantially reduced.

2. A monolithic integrated memory circuit as claimed in claim 1, characterized in that the active level shift circuit is formed by a first pair of drain-coupled field effect transistors whose common drains are connected to a positive DC supply voltage $V_{DD}$, their gates receiving the signals of the bit lines of the memory column, a second pair of field effect transistors and a resistance, each of the sources of said first pair of transistors being connected to the drain of one of the transistors of the second pair of field effect transistors whose sources are connected to ground via said resistance and whose gates are cross-wise connected to the drain of the opposed transistor of the pair and to the respective gate of the transistors of the differential read amplifier, two paired resistances, the lines of the read bus being connected to the DC supply voltage $V_{DD}$ by said paired resistances.

3. A monolithic integrated memory circuit as claimed in claim 1, wherein said group III–V material comprises Gallium Arsenide.

* * * * *